United States Patent
Yu et al.

(10) Patent No.: US 6,784,101 B1
(45) Date of Patent: Aug. 31, 2004

(54) FORMATION OF HIGH-K GATE DIELECTRIC LAYERS FOR MOS DEVICES FABRICATED ON STRAINED LATTICE SEMICONDUCTOR SUBSTRATES WITH MINIMIZED STRESS RELAXATION

(76) Inventors: Bin Yu, 1373 Poppy Way, Cupertino, CA (US) 95014; David Wu, 10222 Dianella La., Austin, TX (US) 78759

( * ) Notice: Subject to any disclaimer, the term of this patent is extended or adjusted under 35 U.S.C. 154(b) by 119 days.

(21) Appl. No.: 10/146,029

(22) Filed: May 16, 2002

(51) Int. Cl.⁷ .............................................. H01L 21/44
(52) U.S. Cl. ...................... 438/666; 438/197; 438/198; 438/199
(58) Field of Search .................... 438/666, 197–201, 438/287, 585–596, 216, 261, 785; 257/288, 285–296, 368–369, 410–413, 900

(56) References Cited

U.S. PATENT DOCUMENTS

| | | | |
|---|---|---|---|
| 4,181,538 A | * | 1/1980 | Narayan et al. ............. 136/261 |
| 6,063,698 A | | 5/2000 | Tseng et al. |
| 6,100,204 A | | 8/2000 | Gardner et al. |
| 6,197,641 B1 | * | 3/2001 | Hergenrother et al. ............ 257/ |
| | | | E29.084 |
| 6,444,592 B1 | * | 9/2002 | Ballantine et al. ............ 438/770 |
| 6,509,587 B2 | * | 1/2003 | Sugiyama et al. ............ 257/192 |
| 2002/0100942 A1 | * | 8/2002 | Fitzgerald et al. ............ 257/369 |
| 2003/0049942 A1 | * | 3/2003 | Haukka et al. ............... 438/778 |

FOREIGN PATENT DOCUMENTS

EP          973189 A2  *  1/2000    ............ H01L/21/28

* cited by examiner

Primary Examiner—Wael Fahmy
Assistant Examiner—Nathan W. Ha
(74) Attorney, Agent, or Firm—McDermott Will & Emery LLP

(57) ABSTRACT

A semiconductor device is formed by providing a semiconductor substrate comprising a strained lattice semiconductor layer at an upper surface thereof and having a pre-selected amount of lattice therein, forming a thin buffer/interfacial layer of a low-k dielectric material on the upper surface of the semiconductor substrate, and forming a layer of a high-k dielectric material on the thin buffer/interfacial layer of a low-k dielectric material. Embodiments include forming the thin buffer/interfacial layer and high-k layer at a minimum temperature sufficient to effect formation of the respective dielectric layer without incurring, or at least minimizing, strain relaxation of the strained lattice semiconductor layer.

20 Claims, 2 Drawing Sheets

FORMATION OF HIGH-K GATE DIELECTRIC LAYERS FOR MOS DEVICES FABRICATED ON STRAINED LATTICE SEMICONDUCTOR SUBSTRATES WITH MINIMIZED STRESS RELAXATION

FIELD OF THE INVENTION

The present invention relates generally to the manufacture of high speed, high performance MOS semiconductor devices fabricated on strained lattice semiconductor substrates, and MOS devices obtained thereby. Specifically, the present invention relates to an improved method of manufacturing MOS devices including gate insulator layers comprised of high-k dielectric materials on strained lattice semiconductor substrates, which method substantially eliminates, or at least minimizes, stress relaxation of the strained lattice semiconductor layer attendant upon gate insulator layer formation.

BACKGROUND OF THE INVENTION

Recently, there has been much interest in investigating the feasibility of various approaches having the aim or goal of developing new semiconductor materials which provide increased speeds of electron and hole flow therethrough, thereby permitting fabrication of semiconductor devices, such as integrated circuit (IC) devices, with higher operating speeds, enhanced performance characteristics, and lower power consumption. One such material which shows promise in attaining the goal of higher device operating speeds is termed "strained silicon".

According to this approach, a very thin, tensilely strained, crystalline silicon (Si) layer is grown on a relaxed, graded composition Si—Ge buffer layer several microns thick, which Si—Ge buffer layer is, in turn, formed on a suitable crystalline substrate, e.g., a Si wafer or a silicon-on-insulator (SOI) wafer. Strained Si technology is based upon the tendency of the Si atoms, when deposited on the Si—Ge buffer layer, to align with the greater lattice constant (spacing) of the Si and Ge atoms therein (relative to pure Si). As a consequence of the Si atoms being deposited on the Si—Ge substrate comprised of atoms which are spaced further apart than in pure Si, they "stretch" to align with the underlying lattice of Si and Ge atoms, thereby "stretching" or tensilely straining the deposited Si layer. Electrons and holes in such strained Si layers have greater mobility than in conventional, relaxed Si layers with smaller inter-atom spacings, i.e., there is less resistance to electron and/or hole flow. For example, electron flow in strained Si may be up to about 70% faster compared to electron flow in conventional Si. Transistors and IC devices formed with such strained Si layers can exhibit operating speeds up to about 35% faster than those of equivalent devices formed with conventional Si, without necessity for reduction in transistor size.

Another tactic for improving the performance of semiconductor devices, e.g., MOS devices such as PMOS and NMOS transistors and CMOS devices, involves increasing the capacitance between the gate electrode and the underlying channel region within the semiconductor substrate. Typically, the capacitance is increased by decreasing the thickness of the gate dielectric layer, typically an oxide layer such as a silicon oxide, to below about 100 Å. Currently, silicon oxide, e.g., $SiO_2$, gate dielectric layer thicknesses are approaching about 40 Å or less. However, the utility of silicon oxide as a gate dielectric is severely limited at such reduced thicknesses, e.g., due to direct tunneling through the gate dielectric layer to the underlying channel region, thereby increasing the gate-to-channel leakage current and an increase in power consumption.

Inasmuch as further reduction in the silicon oxide gate dielectric thickness is impractical in view of the above-mentioned increase in gate-to-channel leakage current, various approaches have been investigated for reducing the gate-to-channel leakage current while maintaining a thin $SiO_2$ "equivalent thickness", i.e., the thickness of a non-$SiO_2$ dielectric layer determined by multiplying a given $SiO_2$ thickness by the ratio of the dielectric constant of the non-$SiO_2$ dielectric to that of $SiO_2$, i.e., $k_{non-SiO2}/k_{SiO2}$. Thus, one approach which has been investigated is the use of materials with dielectric constants higher than that of silicon oxide materials as gate dielectric materials, whereby the "high-k" dielectric materials, i.e., materials with dielectric constants of about 5 or above, replace the conventional silicon oxide-based "low-k" dielectric materials with dielectric constants of about 4 or below. The increased capacitance k (or permittivity $\in$) of the gate dielectric material advantageously results in an increase in the gate-to-channel capacitance, which in turn results in improved device performance. Since the capacitance C is proportional to the permittivity $\in$ of the gate dielectric material divided by the thickness t of the gate dielectric layer, it is evident that the use of a high-k (or high-$\in$) material permits use of thicker gate dielectric layers, i.e., >40 Å, whereby both greater capacitance and device speed are obtained with less gate-to-channel leakage current.

Typically, high-k dielectric materials, i.e., with $k \geqq 5$, suitable for use as gate dielectric layers in the manufacture of semiconductor devices, are formed with a physical thickness from about 40 to about 500 Å, typically 40–100 Å (or a $SiO_2$ equivalent thickness less than about 40 Å), and comprise metal and oxygen-containing material including at least one dielectric material selected from the group consisting of metal oxides, metal silicates, metal aluminates, metal titanates, metal zirconates, ferroelectric materials, binary metal oxides, and ternary metal oxides. Suitable metal oxides include aluminum oxide, hafnium oxide, zirconium oxide, lanthanum oxide, titanium oxide, tantalum oxide, tungsten oxide, cerium oxide, and yttrium oxide; suitable metal silicates include zirconium silicate, and hafnium silicate; suitable metal aluminates include hafnium aluminate and lanthanum aluminate; suitable metal titanates include lead titanate, barium titanate, strontium titanate, and barium strontium titanate; suitable metal zirconates include lead zirconate; and suitable ferroelectric and/or ternary metal oxides include PST ($PbSc_xTa_{1-x}O_3$), PZN ($PbZn_xNb_{1-x}O_3$), PZT ($PbZr_xTi_{1-x}O_3$), and PMN ($PbMg_xNb_{1-x}O_3$). Deposition of the high-k metal oxide layers and/or post-deposition treatment of the high-k metal oxide layers typically involves processing at elevated temperatures, e.g., at about 500–900° C. in the case of aluminum oxide ($Al_2O_3$) deposition from an $AlCl_3/O_2$ ambient.

However, an important concern in the manufacture of practical semiconductor devices utilizing strained semiconductor layers, e.g., strained Si layers, is the requirement for maintaining the tensilely strained condition of the strained semiconductor layer throughout device processing, without incurring significant strain relaxation disadvantageously leading to reduction in electron/hole mobility resulting in degradation in device performance characteristics. For example, many device fabrication steps, including for example, the above-described high-k dielectric deposition and post-treatment, frequently involve high temperature processing at temperatures on the order of about 900–1,100° C. for intervals sufficient to result in significant relaxation of the tensile strain of the Si layer, which in turn, results in a lowering of the electron and hole mobilities therein to values comparable to those of conventional Si layers, whereby the potential advantages attributable to enhanced electron/hole mobility in the strained Si layer are partially or wholly lost.

Accordingly, there exists a need for improved methodology for fabrication of semiconductor devices with strained semiconductor layers, notably strained Si layers, which substantially eliminates, or at least minimizes, deleterious stress relaxation during device processing at elevated temperatures, e.g., as in the formation of high-k dielectric gate insulator layers as part of a process sequence for the manufacture of MOS-type transistors and CMOS devices.

The present invention, wherein processing for deposition of high-k dielectric gate insulator layers and buffer layers therefor, e.g., metal oxide-based high-k dielectrics and silicon oxide-based buffer layers, forming part of a sequence of steps for fabricating MOS-type transistors and CMOS devices, is performed at temperatures which effectively eliminate, or at least minimize, disadvantageous strain relaxation of the strained lattice semiconductor arising from the thermal annealing. As a consequence, the inventive methodology facilitates manufacture of high speed, high performance, reduced power consumption semiconductor devices utilizing strained semiconductor technology. Further, the methodology afforded by the present invention enjoys diverse utility in the manufacture of numerous and various semiconductor devices and/or components therefor which require use of strained semiconductor technology for enhancement of device speed and lower power consumption.

DISCLOSURE OF THE INVENTION

An advantage of the present invention is an improved method for manufacturing a semiconductor device comprising a strained lattice semiconductor layer.

Another advantage of the present invention is an improved method for manufacturing a semiconductor device comprising formation of a high-k dielectric gate oxide layer on a strained lattice semiconductor layer without incurring significant stress relaxation.

Still another advantage of the present invention is an improved method for fabricating a MOS-type semiconductor device on a strained lattice semiconductor layer.

Yet another advantage of the present invention are improved MOS-type semiconductor devices fabricated on strained lattice semiconductor substrates.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the invention, the foregoing and other advantages are obtained in part by a method of manufacturing a semiconductor device, comprising the sequential steps of:

(a) providing a semiconductor substrate comprising a strained; lattice semiconductor layer at an upper surface thereof, the strained lattice semiconductor layer having a pre-selected amount of lattice strain therein;

(b) forming a thin buffer/interfacial layer of a low-k dielectric material on the upper surface of the semiconductor substrate; and (c) forming a layer of a high-k dielectric material on the thin buffer/interfacial layer of a low-k dielectric material, wherein:

steps (b) and (c) are each performed at a minimum temperature sufficient to effect formation of the respective dielectric layer without incurring, or at least minimizing, strain relaxation of the strained lattice semiconductor layer.

According to embodiments of the present invention, step (a) comprises providing a semiconductor substrate including a crystalline, graded composition Si—Ge layer, with a lattice-matched crystalline silicon (Si) layer on a first side of the Si—Ge layer and comprising the strained lattice semiconductor layer; and according to particular embodiments of the present invention, step (a) further comprises providing a semiconductor substrate including a crystalline Si layer on a second, opposite side of the Si—Ge layer;

In accordance with embodiments of the present invention, step (b) comprises forming the thin buffer/interfacial layer of a low-k dielectric material having a dielectric constant k less than 5 and at a thickness from about 2 to about 6 Å.

According to particular embodiments of the present invention, step (b) comprises forming the thin buffer/interfacial layer of a low-k dielectric material from at least one material selected from the group consisting of silicon oxides and silicon oxynitrides and at a temperature ranging from about 200 to about 400° C., by means of an atomic layer deposition (ALD) method selected from chemical vapor deposition (CVD), molecular beam deposition (MBD), and physical vapor deposition (PVD).

Embodiments of the invention include performing step (c) by forming a layer of a high-k dielectric material having a dielectric constant k greater than 5 and a thickness from about 40 to about 100 Å.

According to particular embodiments of the present invention, step (c) comprises forming the layer of a high-k dielectric material from at least one metal and oxygen-containing material selected from the group consisting of metal oxides, metal silicates, metal aluminates, metal titanates, metal zirconates, ferroelectric materials, binary metal oxides, and ternary metal oxides, i.e., step (c) comprises forming the layer of a high-k dielectric material from at least one material selected from the group consisting of aluminum oxide, hafnium oxide, zirconium oxide, lanthanum oxide, titanium oxide, tantalum oxide, tungsten oxide, cerium oxide, yttrium oxide, zirconium silicate, hafnium silicate, hafnium aluminate, lanthanum aluminate, lead titanate, barium titanate, strontium titanate, barium strontium titanate, lead zirconate; ferroelectric oxides, ternary metal oxides, PST ($PbSc_xTa_{1-x}O_3$), PZN ($PbZn_xNb_{1-x}O_3$), PZT ($PbZr_xTi_{1-x}O_3$), and PMN ($PbMg_xNb_{1-x}O_3$); wherein step (c) comprises forming the layer of a high-k dielectric material at a temperature ranging from about 200 to about 400° C., by means of an atomic layer deposition (ALD) method selected from chemical vapor deposition (CVD), molecular beam deposition (MBD), and physical vapor deposition (PVD).

In accordance with embodiments of the present invention, the method further comprises sequential steps of:

(d) forming an electrically conductive layer on the layer of a high-k dielectric material; and (e) patterning the electrically conductive layer, the layer of a high-k dielectric material, and the thin buffer layer of a low-k dielectric material to form at least one gate insulator layer/gate electrode stack on at least one portion of the upper surface of the semiconductor substrate;

(f) implanting dopant species of one conductivity type into the semiconductor substrate utilizing the at least one gate insulator layer/gate electrode stack as an implantation mask, thereby forming at least one pair of shallow depth source/drain extension regions in the semiconductor substrate vertically aligned with opposite side edges of the at least one gate insulator layer/gate electrode stack;

(g) forming insulative sidewall spacers on the opposite side edges of the at least one gate insulator layer/gate electrode stack;

(h) implanting dopant species of the one conductivity type into the semiconductor substrate utilizing the at least one gate insulator layer/gate electrode stack with the insulative sidewall spacers thereon as an implantation mask, thereby forming at least one pair of deeper source/drain regions in the semiconductor substrate vertically aligned with opposite side edges of the sidewall spacers; and (i) thermally annealing the thus-formed structure for a minimum interval sufficient to activate the dopant species implanted in the at least one pair of shallow depth source/drain regions and in the at least one pair of deeper source/drain regions without incurring, or at least minimizing, strain relaxation of the strained lattice semiconductor layer.

According to particular embodiments of the present invention, step (i) comprises performing laser thermal annealing (LTA) or rapid thermal annealing (RTA) at a temperature from about 1,200 to about 1,400° C. for from about 1 to about 100 nanosec.

Another aspect of the present invention are PMOS or NMOS transistors and CMOS and IC devices manufactured according to the above method.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein.

DESCRIPTION OF THE INVENTION

The present invention is based upon the discovery that formation of high quality, high speed semiconductor devices, e.g., MOS devices such as PMOS transistors, NMOS transistors, and CMOS devices, suitable for use in the manufacture of integrated circuit (IC) devices, can be readily fabricated on or within strained lattice semiconductor materials and substrates by means of a process which substantially eliminates, or at least minimizes, stress relaxation in the strained lattice semiconductor material arising from elevated temperature processing during formation thereon of thin buffer oxide (or interfacial oxide) and high-k dielectric layers (for use as gate dielectric layers), which stress relaxation disadvantageously mitigates the benefit of increased electron and/or hole mobility, hence operating speed, attributed to the strained lattice semiconductor substrates.

A key feature of the present invention is performing atomic layer deposition (ALD) of the thin buffer/interfacial oxide and high-k gate dielectric layers on the surface of the strained lattice semiconductor material at temperatures substantially lower than those associated with conventional deposition methodologies, and is based upon recognition by the inventors that such atomic layer deposition performed at lower-than-conventional deposition temperatures can facilitate manufacture of high speed, high performance MOS-based semiconductor devices based on strained lattice semiconductor materials advantageously having the same amount of lattice strain, hence enhanced charge carrier mobilities, as the initial strained lattice semiconductor materials. As a consequence of the inventive methodology, the advantages of increased charge carrier mobility, including increased device operating speed, attributable to the use of strained lattice semiconductor starting materials, are retained, i.e., not lost or reduced as a result of lattice stress relaxation arising from thermal processing at elevated temperatures during device manufacture. Advantageously, the inventive methodology may be utilized in the manufacture of all manner of MOS-based semiconductor devices, including NMOS and PMOS transistors and CMOS devices fabricated on or within strained lattice semiconductor substrates, while maintaining full compatibility with all other aspects of process step sequences for the automated manufacture of such devices.

Figure 1:
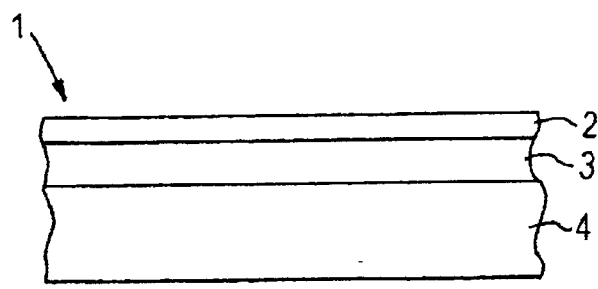
FIGS. 1–7 are schematic, simplified, cross-sectional views illustrating stages in a process for forming a MOS transistor according to an embodiment of the present invention.

Referring to FIGS. 1–7, shown therein are schematic, simplified, cross-sectional views illustrating stages in a process for forming a MOS transistor according to an illustrative, but not limitative, embodiment of the present invention. With particular reference to FIG. 1, a substrate/workpiece 1 comprising a thin, strained lattice semiconductor layer 2 at an upper surface thereof is provided, which thin, strained lattice semiconductor layer 2 is lattice-matched to a relatively thicker, underlying crystalline semiconductor buffer layer 3 of different composition, the latter being in overlying contact with a suitable substrate 4. By way of illustration only, the thin, strained lattice semiconductor layer 2 may comprise a tensilely strained, crystalline Si layer from about 50 to about 200 Å thick, grown on a strain-relaxed, graded composition Si—Ge buffer layer 3 several μm thick, which buffer layer is, in turn, formed on a suitable substrate 4, e.g., a crystalline Si wafer or a silicon-on-insulator (SOI) substrate. As indicated supra, when the Si atoms of the strained lattice semiconductor layer 2 are deposited on the Si—Ge buffer layer 3 in alignment with the greater lattice constant (i.e., spacing) of the Si and Ge atoms therein, relative to pure Si, the deposited Si atoms tend to "stretch" to align with the underlying lattice of Si and Ge atoms, thereby "stretching" or tensilely straining Si layer 2. Typical thicknesses of tensilely stressed Si strained lattice semiconductor layers 2 formed on a graded composition Si—Ge buffer layers 3 range from about 500 Å to about 2 μm. Electron and/or hole mobilities in such Si strained lattice semiconductor layers 2 can be as much as about 70% greater than in conventional, relaxed lattice Si, and transistors and IC devices formed therewith can be up to about 35% faster than equivalent devices formed with conventional Si, without any requirement for size reduction.

Figure 2:
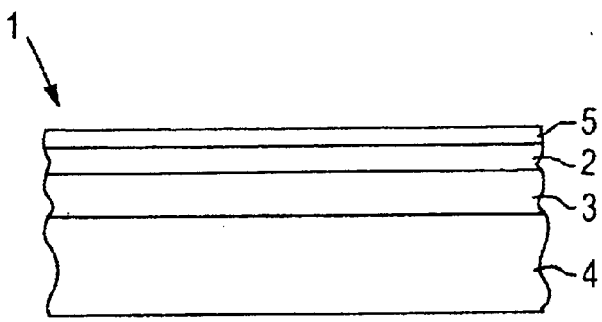

Referring now to FIG. 2, according to the next step of the inventive methodology, a very thin, i.e., about 2–6 Å thick, buffer/interfacial oxide layer 5 of a low-k dielectric material having a dielectric constant k<5, typically a silicon oxide, such as $SiO_2$, or a silicon oxynitride (SiON), is deposited in contact with the upper surface of strained lattice semiconductor layer 2, as by an atomic layer deposition process (ALD) conducted at a relatively low temperature within the range from about 200 to about 400° C., i.e., a metal-organo chemical vapor deposition (MOCVD), molecular beam deposition (MBD), or physical vapor deposition (PVD) process, wherein the process per se is performed at a temperature within the above range, or the strained lattice semiconductor workpiece 1 is maintained at a temperature within the desired range by means of active cooling. Buffer/interfacial oxide layer 5 serves to prevent undesirable interaction between the strained lattice semiconductor layer 2 and a subsequently deposited high-k gate dielectric layer 6 (see FIG. 3), particularly when the substrate is constituted of Si strained lattice semiconductor layer 2 on a Si—Ge buffer layer 3.

One such undesirable interaction prevented by formation of the thin buffer/interfacial oxide layer 5 is the uncontrolled oxidation of the strained lattice semiconductor layer 2 during deposition of the high-k gate dielectric layer 6 by oxidizing species utilized in forming the latter, and by oxygen present in the metal oxide materials commonly utilized for layer 6. Such oxide layers may be formed in addition to any native oxide layer on the surface of strained lattice Si layer 2, and may be more readily formed when such native oxide layer is present. Such interactions, and the presence of the native oxide layer, either lead to an undesirably thick oxide layer at an interface between the strained semiconductor 2 and the high-k gate dielectric layer 6, or lead to degradation of the high-k value of layer 6 by formation of a composite dielectric material having a lower-than-desired k value. In either instance, the equivalent oxide thickness (EOT) of the gate dielectric layer is disadvantageously reduced.

Figure 3:
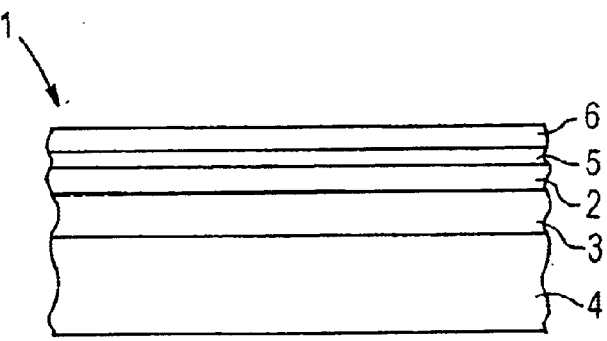

Adverting to FIG. 3, according to the next step of the invention, a layer 6 of a high-k dielectric material having a dielectric constant k greater than 5 and a thickness from about 40 to about 100 Å is formed on the thin buffer/interfacial layer 5, as by a relatively low temperature process akin to that utilized for forming the latter, e.g., by an atomic layer deposition process (ALD) conducted at a temperature within the range from about 200 to about 400° C., illustratively a metal-organo chemical vapor deposition (MOCVD), molecular beam deposition (MBD), or physical vapor deposition (PVD) process, wherein the process per se is performed at a temperature within the above range, or the strained lattice semiconductor workpiece 1 is maintained at a temperature within the desired range by means of active cooling.

According to exemplary embodiments of the present invention, gate dielectric layer 6 of a high-k material comprises at least one metal and oxygen-containing material selected from the group consisting of metal oxides, metal silicates, metal aluminates, metal titanates, metal zirconates, ferroelectric materials, binary metal oxides, and ternary metal oxides. More specifically, layer 6 may comprise at least one material selected from the group consisting of aluminum oxide, hafnium oxide, zirconium oxide, lanthanum oxide, titanium oxide, tantalum oxide, tungsten oxide, cerium oxide, yttrium oxide, zirconium silicate, hafnium silicate, hafnium aluminate, lanthanum aluminate, lead titanate, barium titanate, strontium titanate, barium strontium titanate, lead zirconate; ferroelectric oxides, ternary metal oxides, PST ($PbSc_xTa_{1-x}O_3$), PZN ($PbZn_xNb_{1-x}O_3$), PZT ($PbZr_xTi_{1-x}O_3$), and PMN ($PbMg_xNb_{1-x}O_3$).

Figure 4:
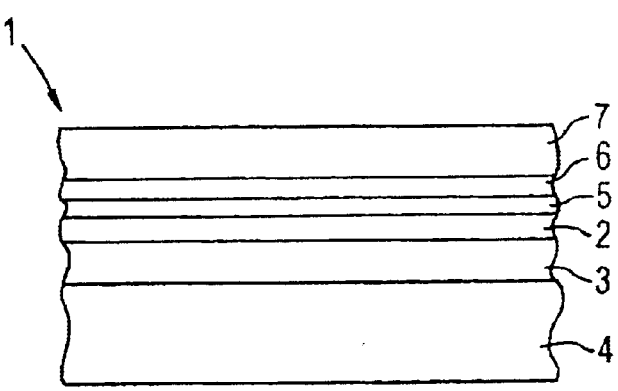

Referring to FIG. 4, an electrically conductive layer 7 for use as a gate electrode layer is then formed in overlying relation with high-k gate dielectric layer 6 at a thickness of about 2,000 Å, as by a conventional method such as CVD, PVD, PECVD, etc., performed at a sufficiently low temperature as to not incur stress relaxation of strained lattice semiconductor layer 2. Suitable electrically conductive materials for use as gate electrode layer 7 include semiconductors such as polysilicon, doped polysilicon, amorphous silicon; metals such as W, Ti, Mo, and metal compounds such as TiN.

Figure 5:
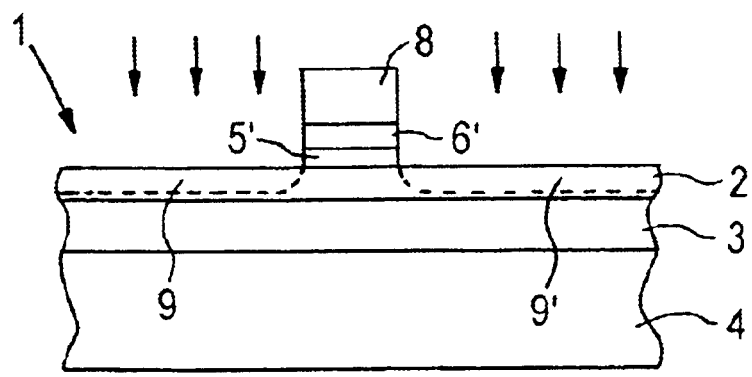

As next shown in FIG. 5, electrically conductive layer 7 is then patterned, as by conventional photolithographic masking and etching techniques not described herein for brevity, to define gate electrode 8, during which patterning the unmasked portions of the high-k layer 6 and buffer/interfacial layer 5 are partly or entirely removed to leave high-k gate oxide layer portion 6' and buffer/interfacial layer portion 5' beneath and aligned with gate electrode 8. Lightly-doped (LDD) source/drain extension regions 9 and 9' are then selectively formed in portions of the strained lattice semiconductor layer 2 not masked by gate electrode 8, as by dopant ion implantation. By way of illustration, but not limitation, LDD source/drain extension regions 9 and 9' may be formed by implanting ions of an n-type dopant, e.g., As ions of about 5–30 KeV energy at a dosage from about $5 \times 10^{13}$ to about $8 \times 10^{14}$ ions/cm$^2$.

Figure 6:
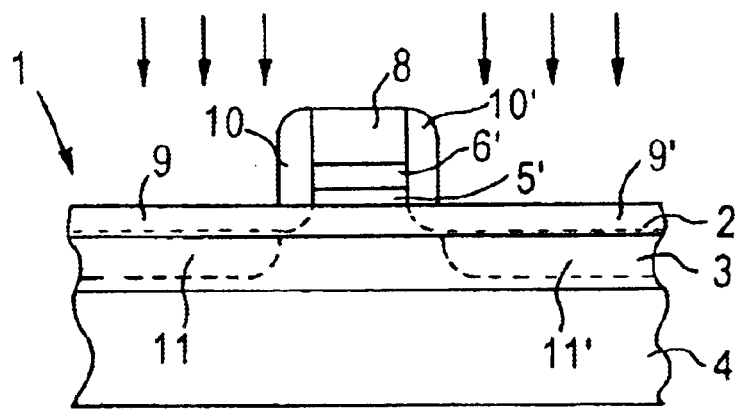

Referring now to FIG. 6, in the next steps according to the invention, dielectric sidewall spacers 10, 10' are formed on the opposite side edges of gate electrode 8, as by conventional techniques comprising deposition of a blanket dielectric layer over the side and top surfaces of gate electrode 8 and the exposed side edge surfaces of the high-k gate dielectric layer portion 6', followed by anisotropic etching to remove unwanted portions of the blanket dielectric layer. Heavier doped source/drain regions 11 and 11' are then formed by ion implantation self-aligned to the sidewall spacers 10, 10'. By way of illustration, but not limitation, the heavier doped source/drain regions 11 and 11' may be formed by implanting ions of an n-type dopant, e.g., As ions of about 5–30 KeV energy at a dosage from about $2 \times 10^{15}$ to about $7 \times 10^{15}$ ions/cm$^2$.

Figure 7:
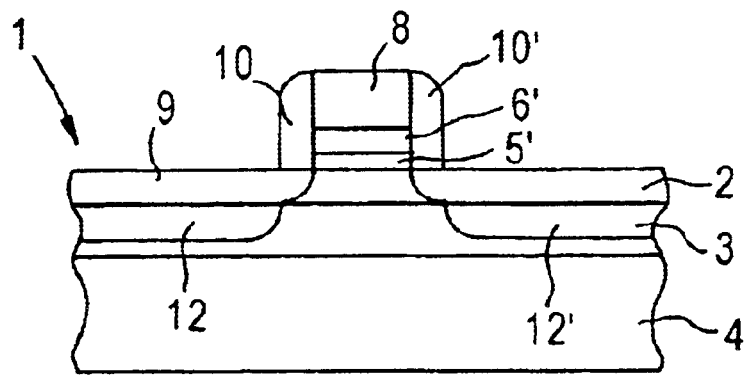

Referring now to FIG. 7, the thus-formed structure is subjected to thermal annealing to: (1) deactivate (i.e., effectively remove) any bulk and/or interface traps present within the high-k gate oxide layer portion 6' and at the interface with the strained lattice semiconductor layer 2; and (2) activate the implanted dopant impurities in the LDD source/drain extension regions 9 and 9' and in the heavier-doped source/drain regions 11 and 11', thereby forming source/drain regions 12, 12'. As in the previous processing steps, the annealing is performed under conditions selected to avoid stress relaxation of the strained lattice semiconductor layer 2, e.g., by annealing for a minimum interval sufficient to achieve the above-mentioned results (1) and (2). By way of illustration only, laser thermal annealing (LTA) or rapid thermal annealing (RTA) may be performed at a temperature from about 1,200 to about 1,400° C. for from about 1 to about 100 nanosec.

The present invention, wherein disadvantageous stress relaxation of the strained lattice semiconductor layer 2 is eliminated, or at least minimized, enables reliable formation of semiconductor substrates for use in the manufacture of all manner of high-quality, high operating speed MOS-based devices with high-k gate insulator layers, including MOS transistors and CMOS devices, while retaining the advantages of enhanced charge carrier mobility afforded by the use of strained semiconductor lattice materials. Moreover, the invention can be practiced by use of conventional methodologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, comprising sequential steps of:
    (a) providing a semiconductor substrate comprising a strained lattice semiconductor layer at an upper surface thereof, said strained lattice semiconductor layer having a pre-sleeted amount of lattice strain therein;
    (b) forming a thin buffer/interfacial layer of a low-k dielectric material on said upper surface of said semiconductor substrate; and
    (c) forming a layer of a high-k dielectric material on said thin buffer/interfacial layer of a low-k dielectric material, wherein:
    steps (b) and (c) are each performed at a minimum temperature sufficient to effect formation of the respective dielectric layer without incurring, or at least minimizing, strain relaxation of said strained lattice semiconductor layer.

2. The method as in claim 1, wherein:
    step (a) comprises providing a semiconductor substrate including a crystalline, graded composition Si—Ge layer, with a lattice-matched crystalline silicon (Si) layer on a first side of said Si—Ge layer and comprising said strained lattice semiconductor layer.

3. The method as in claim 2, wherein:
    step (a) further comprises providing a semiconductor substrate including a crystalline Si layer on a second, opposite side of said Si—Ge layer.

4. The method as in claim 1, wherein:
    step (b) comprises forming said thin buffer/interfacial layer of a low-k dielectric material having a dielectric constant k less than 5.

5. The method as in claim 4, wherein:
    step (b) comprises forming said thin buffer/interfacial layer of a low-k dielectric material at a thickness from about 2 to about 6 Å.

6. The method as in claim 4, wherein:
    step (b) comprises forming said thin buffer/interfacial layer of a low-k dielectric material from at least one material selected from the group consisting of silicon oxides and silicon oxynitrides.

7. The method as in claim 5, wherein:
    step (b) comprises forming said thin buffer/interfacial layer of a low-k dielectric material at a temperature ranging from about 200 to about 400° C.

8. The method as in claim 7, wherein:
    step (b) comprises forming said thin buffer/interfacial layer of a low-k dielectric material by an atomic layer deposition (ALD) method selected from chemical vapor deposition (CVD), molecular beam deposition (MBD), and physical vapor deposition (PVD).

9. The method as in claim 1, wherein:
    step (c) comprises forming said layer of a high-k dielectric material having a dielectric constant k greater than 5.

10. The method as in claim 9, wherein:
    step (c) comprises forming said layer of a high-k dielectric material at a thickness from about 40 to about 100 Å.

11. The method as in claim 9, wherein:
    step (c) comprises forming said layer of a high-k dielectric material from at least one metal and oxygen-containing material selected from the group consisting of metal oxides, metal silicates, metal aluminates, metal titanates, metal zirconates, ferroelectric materials, binary metal oxides, and tenary metal oxides.

12. The method as in claim 11, wherein:
    step (c) comprises forming said layer of a high-k dielectric material from at least one material selected from the group consisting of aluminum oxide, hafnium oxide, zirconium oxide, lanthanum oxide, titanium oxide, tantalum oxide, tungsten oxide, cerium oxide, yttrium oxide, zirconium silicate, hafnium silicate, hafnium aluminae, lathanum aluminate, lead titanate, barium titanate, strontium titanate, barium strontium titante, lead zirconate; ferroelectric oxides, ternary metal oxides, PST ($PbSc_xTa_{1-x}O_3$), PZN ($PbZn_xNb_{1-x}O_3$), PZT ($PbZr_xTi_{1-x}O_3$), and PMN ($PbMg_xNb_{1-x}O_3$).

13. The method as in claim 9, wherein:
    step (c) comprises forming said layer of a high-k dielectric material at a temperature ranging from about 200 to about 400° C.

14. The method as in claim 13, wherein:
    step (c) comprises forming said layer of a high-k dielectric material by an atomic layer deposition (ALD) method selected from chemical vapor deposition (CVD), molecular beam disposition (MBD), and physical vapor deposition (PVD).

15. The method as in claim 1, further comprising sequential steps of:
    (d) forming an electrically conductive layer on said layer of a high-k dielectric material; and
    (e) patterning said electrically conductive layer, said layer of a high-k dielectric material, and said thin buffer layer of a low-k dielectric material to form at least one gate insulator layer/gate electrode stack on at least one portion of said upper surface of said semiconductor substrate.

16. The method as in claim 15, further comprising the step of:
    (f) implanting dopant species of one conductivity type into said semiconductor substrate utilizing said at least one gate insulator layer/gate electrode stack as an implantation mask, thereby forming at least one pair of shallow depth source/drain extension regions in said semiconductor substrate vertically aligned with opposite side edges of said at least one gate insulator layer/gate electrode stack.

17. The method as in claim 16, further comprising sequential steps of:
(g) forming insulative sidewall spacers on said opposite side edges of said at least one gate insulator layer/gate electrode stack;
(h) implanting dopant species of said one conductivity type into said semiconductor substrate utilizing said at least one gate insulator layer/gate electrode stack with said insulative sidewall spacers thereon as an implantation mask, thereby forming at least one pair of deeper source/drain regions in said semiconductor substrate vertically aligned with opposite side edges of said sidewall spacers; and
(i) thermally annealing the thus-formed structure for a minimum interval sufficient to activate said dopant species implanted in said at least one pair of shallow depth source/drain regions and in said at least one pair of deeper source/drain regions without incurring, or at least minimizing, strain relaxation of said strained lattice semiconductor layer.

18. The method as in claim 17, wherein:
step (i) comprises performing laser thermal annealing (LTA) or rapid thermal annealing (RTA) at a temperature from about 1,200 to about 1,400° C. for from about 1 to about 100 nanosec.

19. A PMOS or NMOS transistor manufactured according to the method of claim 18.

20. A CMOS or IC device manufactured according to the method of claim 18.

* * * * *

UNITED STATES PATENT AND TRADEMARK OFFICE
CERTIFICATE OF CORRECTION

PATENT NO.       : 6,784,101 B1                                         Page 1 of 1
APPLICATION NO.  : 10/146029
DATED            : August 31, 2004
INVENTOR(S)      : Bin Yu et al.

It is certified that error appears in the above-identified patent and that said Letters Patent is hereby corrected as shown below:

On the Title page

Add item -- (73) Assignee: ADVANCED MICRO DEVICES, INC, Sunnyvale, CA (USA) --

Signed and Sealed this

Twenty-ninth Day of May, 2007

JON W. DUDAS
*Director of the United States Patent and Trademark Office*